US012805340B2

(12) United States Patent

Kainuma

(10) Patent No.: US 12,805,340 B2
(45) Date of Patent: Nov. 17, 2026

(54) STEM AND METHOD OF MANUFACTURING STEM

(71) Applicant: SHINKO ELECTRIC INDUSTRIES CO., LTD., Nagano (JP)

(72) Inventor: Masao Kainuma, Nagano (JP)

(73) Assignee: SHINKO ELECTRIC INDUSTRIES CO., LTD., Nagano (JP)

( * ) Notice: Subject to any disclaimer, the term of this patent is extended or adjusted under 35 U.S.C. 154(b) by 417 days.

(21) Appl. No.: 18/495,246

(22) Filed: Oct. 26, 2023

(65) Prior Publication Data

US 2024/0145347 A1 May 2, 2024

(30) Foreign Application Priority Data

Nov. 1, 2022 (JP) ................................ 2022-175552

(51) Int. Cl.
*H10W 70/20* (2026.01)

(52) U.S. Cl.
CPC .................................. *H10W 70/20* (2026.01)

(58) Field of Classification Search
CPC ..... H01L 23/492; H01L 23/13; H01L 23/043; H01L 23/10; H01L 23/32; H01L 23/045; H01L 23/049; H01L 23/36; H01S 5/02212; H01S 5/0231; H10H 20/85
See application file for complete search history.

(56) References Cited

U.S. PATENT DOCUMENTS

2008/0054927 A1 * 3/2008 Narita ................ G01R 1/06727 324/755.07

FOREIGN PATENT DOCUMENTS

JP H6-314857 A 11/1994
JP 2010-199287 A 9/2010
JP 2021-15849 A 2/2021

OTHER PUBLICATIONS

Japanese Office Action mailed Mar. 31, 2026 issued in corresponding Japanese application No. 2022-175552; English machine translation included (5 pages).

* cited by examiner

*Primary Examiner* — Elias Ullah
(74) *Attorney, Agent, or Firm* — Rankin, Hill & Clark LLP

(57) ABSTRACT

A stem includes a base member and a block member. The base member includes a main body portion and a columnar portion that rises from one surface of the main body portion. The block member incudes a device mounting surface, on which a semiconductor device is able to be mounted, and is fixed to the one surface of the main body portion in a state in which the block member is pressed against the columnar portion.

7 Claims, 9 Drawing Sheets

STEM AND METHOD OF MANUFACTURING STEM

CROSS-REFERENCE TO RELATED APPLICATION

This application is based upon and claims the benefit of priority of the prior Japanese Patent Application No. 2022-175552, filed on Nov. 1, 2022, the entire contents of which are incorporated herein by reference.

FIELD

The embodiments discussed herein are related to a stem and a method of manufacturing the stem.

BACKGROUND

A stem on which a semiconductor device, such as an optical device, is mounted is manufactured by fixing a block member serving as a heat sink to one surface of a disk-shaped base member on which a lead that is to be connected to, for example, a semiconductor device is fixed. The block member is constituted to have a structure such that the main side surface located on, for example, the center side of the base member is a device mounting surface on which the semiconductor device is able to be mounted.

On the stem having the above described structure, the block member is fixed to the one surface of the base member by, for example, brazing. In a case where the block member is fixed to the one surface of the base member by brazing, the block member is sometimes shifted from the reference position that has been determined in advance on the base member caused by stress applied to the block member in association with solidification of the brazing material corresponding to the fixing material after the brazing material has been melted. If the position of the block member has been shifted, accuracy of position of the device mounting surface decreases at the block member. In contrast, in order to adjust the position of the device mounting surface of the block member, there is a proposed technology for performing a shape correction by allowing the device mounting surface to be plastically deformed by pressing a punch against the device mounting surface after the block member has been fixed to the one surface of the base member.

Patent Document 1: Japanese Laid-open Patent Publication No. 2010-199287

However, when the shape correction is performed on the device mounting surface, it is possible to ensure the accuracy of position of the device mounting surface, but it is difficult to abut the punch against the whole surface of the device mounting surface, and thus a part of the device mounting surface may sometimes have a difference in level after the shape correction. Accordingly, a technology for ensuring the accuracy of position of the device mounting surface without performing the shape correction is expected.

Accordingly, the disclosed technology has been conceived in light of the circumstances described above and an object thereof is to provide a stem capable of ensuring accuracy of position of a device mounting surface without performing a shape correction and a method of manufacturing the stem.

SUMMARY

According to an aspect of an embodiment, a stem includes a base member that includes a main body portion, and a columnar portion that rises from one surface of the main body portion; and a block member that includes a device mounting surface, on which a semiconductor device is able to be mounted, and that is fixed to the one surface of the main body portion in a state in which the block member is pressed against the columnar portion.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENT

Preferred embodiment of a stem and a method of manufacturing of the stem disclosed in the present application will be described in detail below with reference to the accompanying drawings. In addition, the disclosed technology is not limited by the embodiment.

Embodiment

Figure 1:
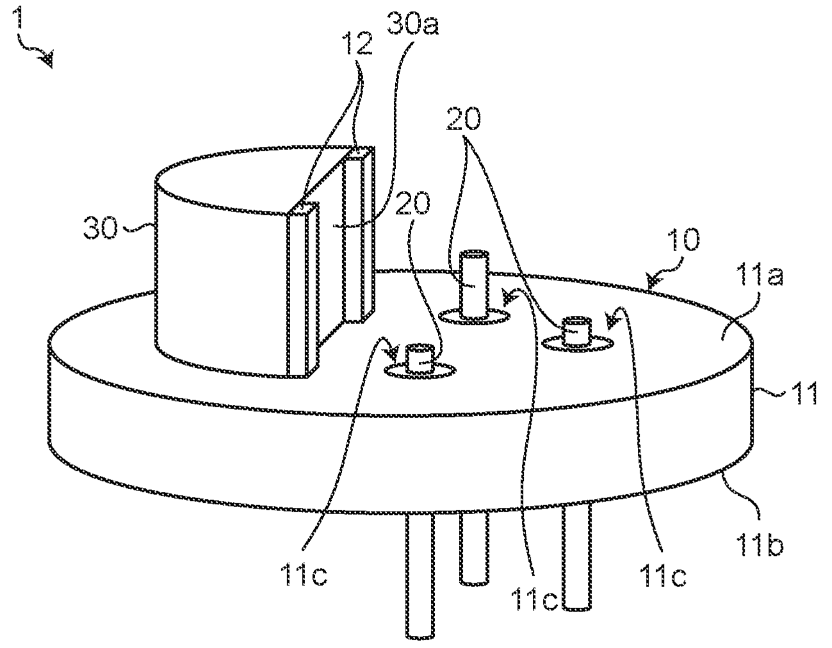
FIG. 1 is a perspective view illustrating a configuration of a stem according to an embodiment.

Configuration of stem FIG. 1 is a perspective view illustrating a configuration of a stem 1 according to an embodiment. As illustrated in FIG. 1, the stem 1 includes a base member 10, a plurality of leads 20, and a block member 30.

The base member 10 is a metal circular member that is made of, for example, iron or the like. The base member 10 is a base material on which various parts including, for example, the plurality of leads 20, the block member 30, and the like are fixed. The base member 10 includes a main body portion 11 and a columnar portion 12.

The main body portion 11 is formed, for example, in a disk shape, and includes an upper surface 11_a_ and a lower surface 11_b_ that is located on the side opposite to the upper surface 11_a_. On the main body portion 11, a plurality of through-holes 11*c* that passes through the upper surface 11*a* and the lower surface 11*b* in a thickness direction of the main body portion 11 are formed. The plurality of through-holes 11*c* are holes that are used for fixing the plurality of respective leads 20 to the base member 10.

The columnar portion 12 is formed, for example, in a quadrangular prism shape, so as to rising from the upper surface 11*a* of the main body portion 11. On the upper surface 11*a* of the main body portion 11, the plurality of (for example, two) columnar portions 12 are formed. Each of the columnar portions 12 is located at a position away from the center of the upper surface 11*a* of the main body portion 11 in a diameter direction of the main body portion 11 by a predetermined distance. Each of the columnar portions 12 is integrally formed with the main body portion 11 by using, for example, press working. The shape of the columnar portion 12 is not limited to a quadrangular prism shape, but may be, for example, a columnar shape, an elliptic columnar shape, or a triangular prism shape.

The plurality of leads 20 are inserted into the plurality of respective through-holes 11*c* that are included in the base member 10, and are fixed to the plurality of respective through-holes 11*c* by using a fixing material having insulation properties. The fixing material used is, for example, glass, an insulating resin, and the like.

The block member 30 is formed such that the main side surface that is disposed opposite, for example, the plurality of leads 20 has a flat semicircular columnar shape. The flat main side surface of the block member 30 is constituted as a device mounting surface 30*a* on which a semiconductor device, such as an optical device, is able to be mounted. The block member 30 has a function of a heat sink that radiates heat generated from the semiconductor device that is mounted on the device mounting surface 30*a*. The block member 30 is fixed to the upper surface 11*a* of the main body portion 11 by, for example, brazing. In other words, fixation of the block member 30 is implemented melting the brazing material that corresponds to the fixing material and that is inserted between the block member 30 and the upper surface 11*a* of the main body portion 11 and then solidifying the brazing material.

Figure 2:
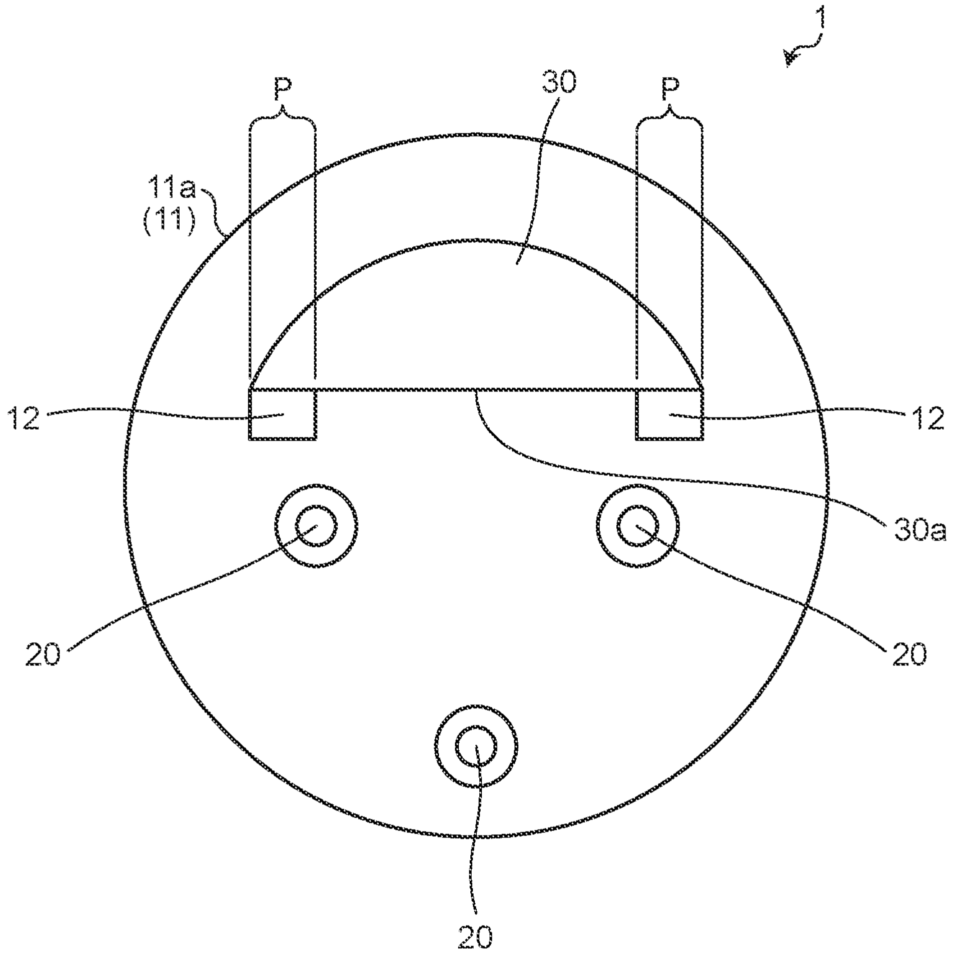
FIG. 2 is a plan view of the stem illustrated in FIG. 1 viewed from an upper surface side.

FIG. 2 is a plan view of the stem 1 illustrated in FIG. 1 viewed from the upper surface 11*a* side. As illustrated in FIG. 1 and FIG. 2, in the embodiment, the block member 30 is fixed to the upper surface 11*a* of the main body portion 11 in the state in which the block member 30 is pressed against the columnar portion 12. For example, the block member 30 is fixed to the upper surface 11*a* of the main body portion 11 in the state in which the block member 30 is pressed against the columnar portion 12 along the direction orthogonal to the device mounting surface 30*a*.

As a result of this, when the block member 30 is fixed to the upper surface 11*a* of the main body portion 11 by brazing, even if stress caused by melting and solidification of the brazing material that is the fixing material is applied to the block member 30, it is possible to determine the position of the block member 30 at a predetermined reference position. Therefore, according to the embodiment, it is possible to prevent the position of the device mounting surface 30*a* of the block member 30 from being shifted, and, as a result, it is possible to ensure accuracy of the position of the device mounting surface 30*a* without performing a shape correction. Furthermore, it is preferable that the device mounting surface 30*a* is located at the reference position that has been set at a position within a range equal to or less than ±30 μm from the center of, for example, the upper surface 11*a* of the main body portion 11 in the diameter direction of the main body portion 11.

Furthermore, in the embodiment, the block member 30 is fixed to the upper surface 11*a* of the main body portion 11 in the state in which the block member 30 is pressed against the plurality of columnar portions 12 (for example, two columnar portions). As a result of this, it is possible to more stably prevent the block member 30 from being shifted from the predetermined reference position. Therefore, according to the embodiment, it is possible to more stably prevent a positional shift of the device mounting surface 30*a* of the block member 30, and it is thus possible to more stably ensure the accuracy of position of the device mounting surface 30*a*.

Furthermore, as illustrated in FIG. 2, in the embodiment, the block member 30 includes areas P in which the block member 30 is pressed against the respective columnar portions 12 on the same surface side as the side of the device mounting surface 30*a* in a plan view of the main body portion 11 viewed from the upper surface 11*a*. For example, the block member 30 includes the two areas P that correspond to the two respective columnar portions 12 on the both side portions that are disposed on the same surface as the side of the device mounting surface 30*a*. In this way, by providing the areas P, in each of which the block member 30 is pressed against by the respective columnar portions 12, on the same surface side as the side of the device mounting surface 30*a*, it is possible to limit a movement of the block member 30 along the direction that is orthogonal to the device mounting surface 30*a*. Therefore, according to the embodiment, it is possible to ensure the accuracy of position of the device mounting surface 30*a* in the direction orthogonal to the device mounting surface 30*a*.

Method of Manufacturing Stem

Figure 3:
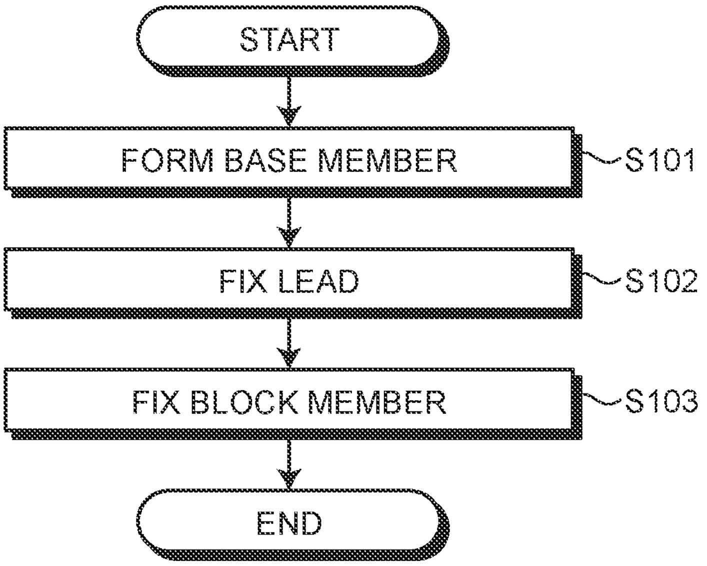
FIG. 3 is a flowchart illustrating one example a method of manufacturing the stem according to the embodiment.

In the following, a method of manufacturing the stem 1 having the configuration described above will be described by using specific examples with reference to FIG. 3. FIG. 3 is a flowchart illustrating one example of the method of manufacturing the stem 1 according to the embodiment.

Figure 4:
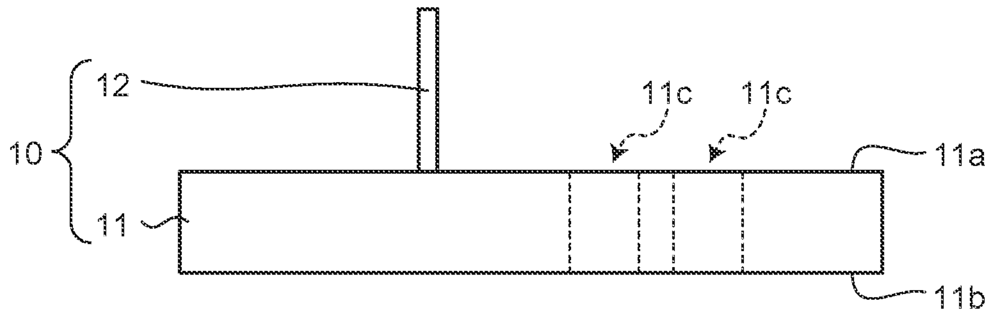
FIG. 4 is a diagram illustrating a specific example of a base member forming step.

First, for example, the base member 10 including the main body portion 11 and the columnar portions 12 is formed by performing press working, or the like on a metallic plate that is made of iron or the like (Step S101). Specifically, for example, as illustrated in FIG. 4, the columnar portions 12 that rises from the upper surface 11*a* of the main body portion 11 is formed as a result of a plastic deformation of an unneeded portion of the metallic plate by the press working operation. Then, by removing the unneeded portion of the metallic plate by the press working operation, the plurality of through-holes 11*c* that pass through the main body portion 11 in the thickness direction are formed. FIG. 4 is a diagram illustrating a specific example of the base member forming step.

Figure 5:
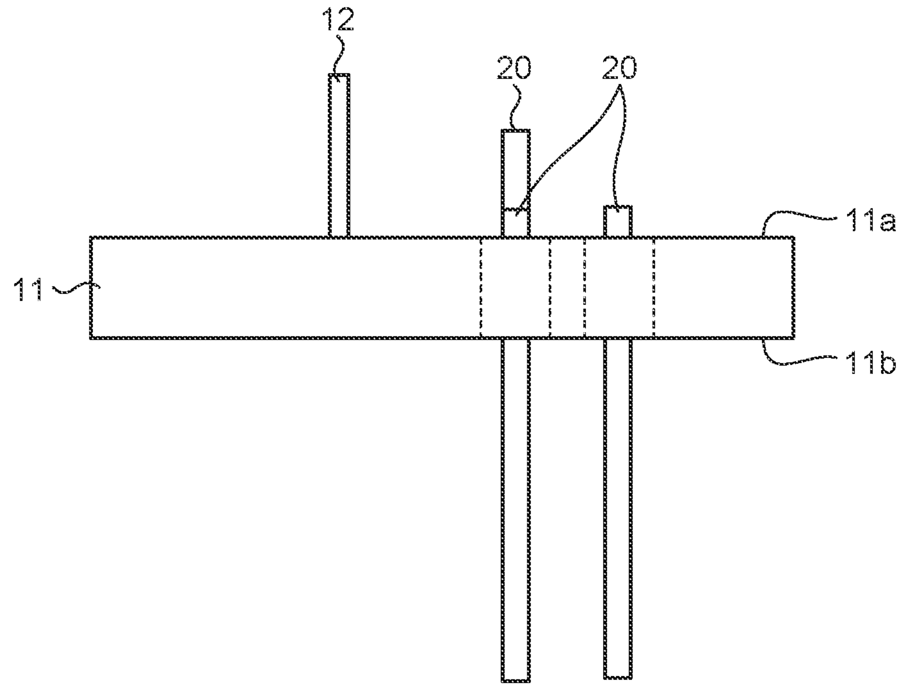
FIG. 5 is a diagram illustrating a specific example of a lead fixing step.

Subsequently, the plurality of leads 20 are fixed to the plurality of respective through-holes 11*c* (Step S102). Specifically, for example, as illustrated in FIG. 5, the plurality of leads 20 are inserted into the plurality of respective through-holes 11*c*, and are fixed to the plurality of respective through-holes 11*c* by the fixing material that has insulation properties. FIG. 5 is a diagram illustrating a specific example of a lead fixing step.

Figure 6:
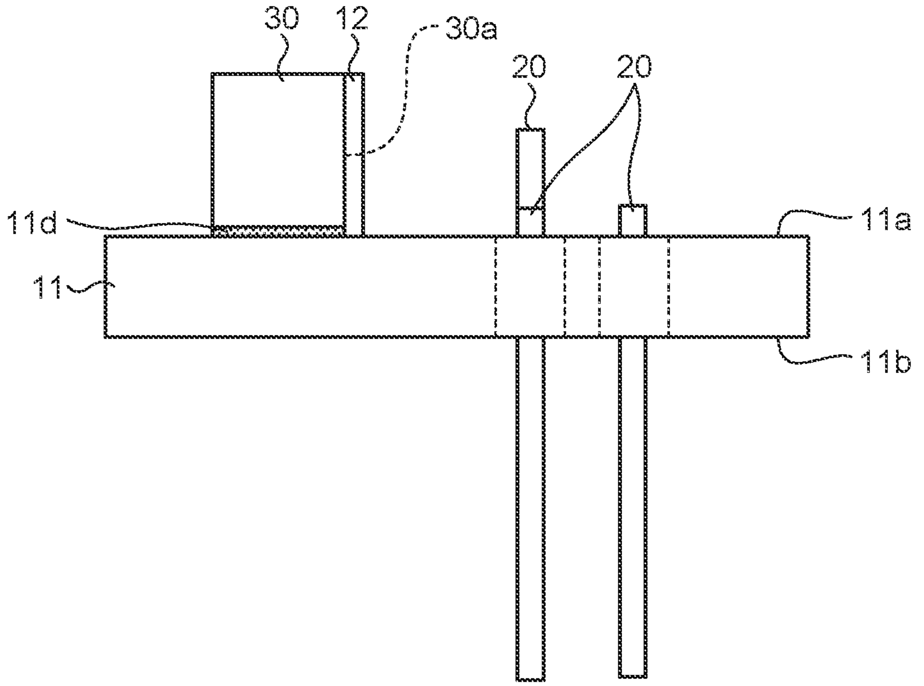
FIG. 6 is a diagram illustrating a specific example of a block member fixing step.

Subsequently, the block member 30 having the device mounting surface 30*a* is fixed to the upper surface 11*a* of the main body portion 11 by brazing in the state in which the block member 30 is pressed against the columnar portions 12 (Step S103). Specifically, for example, as illustrated in FIG. 6, a brazing material 11*d* is arranged on the upper surface 11*a* of the main body portion 11, and the block member 30 is arranged on the brazing material 11*d*. FIG. 6 is a diagram illustrating a specific example of a block member fixing step. Then, for example, as illustrated in FIG. 6, the brazing material 11*d* is melted and solidified by heating and cooling the brazing material 11*d* while the block member 3 is being pressed against the columnar portion 12, so that the block member 30 is fixed to the upper surface 11*a* of the main body portion 11 via the brazing material 11*d*, and the stem 1 has been completed accordingly.

At Step S103, stress is applied to the block member 30 in accordance with solidification of the brazing material 11*d* that is the fixing material after the brazing material 11*d* has been melted. However, the block member 30 is being pressed against the columnar portion 12, so that the block member 30 does not move. As a result of this, it is possible to prevent a shift of the position of the device mounting surface 30*a* of the block member 30, and, as a result, it is possible to ensure the accuracy of position of the device mounting surface 30*a* without performing the shape correction.

Modification

In the following, various modifications according to the embodiment will be described with reference to FIG. 7 to FIG. 11. Furthermore, in the various modifications that will be described below, by assigning the same reference numerals to the same components as those described in the embodiment, overlapping descriptions thereof will be sometimes omitted.

Figure 7:
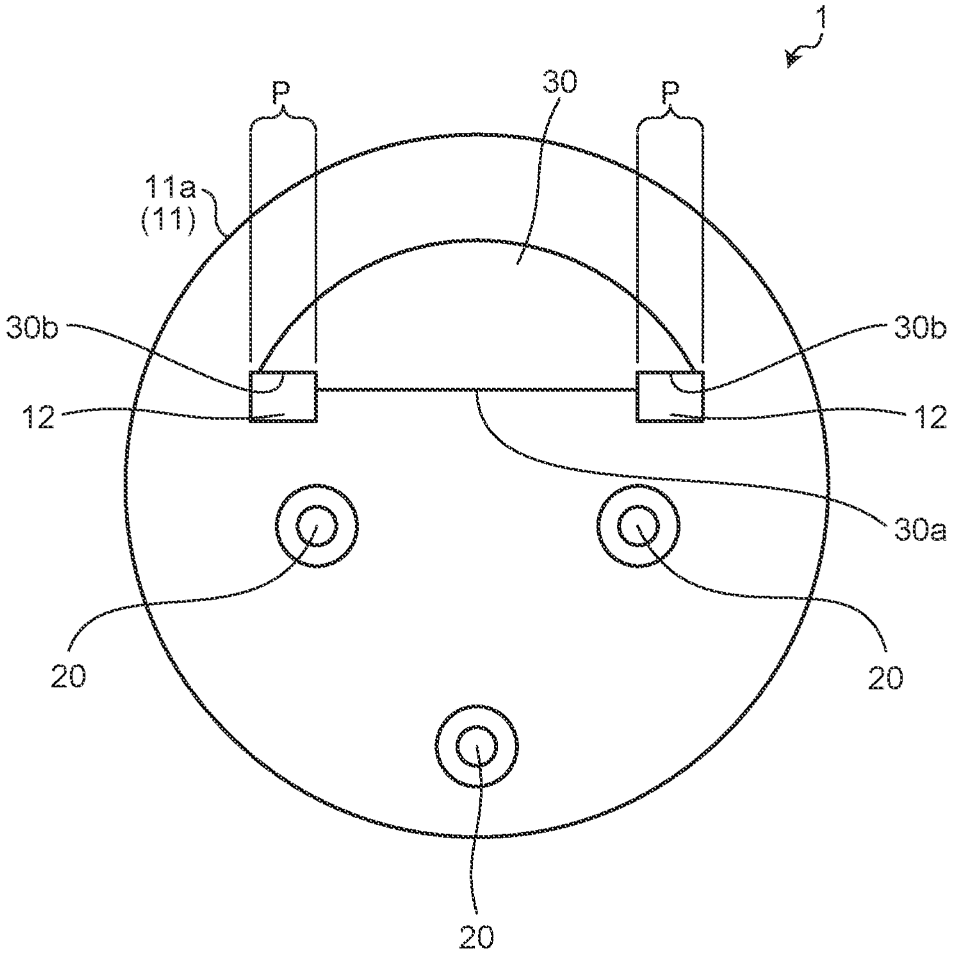
FIG. 7 is a plan view of a stem according a first modification of the embodiment viewed from the upper surface side.

FIG. 7 is a plan view of the stem 1 according to a first modification of the embodiment viewed from the upper surface 11*a*. As illustrated in FIG. 7, in the first modification, the block member 30 includes recess portions 30*b* in the respective areas P in which the block member 30 is pressed against the respective columnar portions 12. The columnar portions 12 are accommodated in the respective recess portions 30*b*. In this way, the recess portions 30*b* are provided in the respective areas P in which the block member 30 is pressed against the respective columnar portions 12, so that it is possible to prevent the block member 30 from moving in the direction parallel to the device mounting surface 30*a*.

Therefore, according to the first modification it is possible to more stably prevent a positional shift of the device mounting surface 30*a* of the block member 30, and it is thus possible to more stably the accuracy of position of the device mounting surface 30*a*

Figure 8:
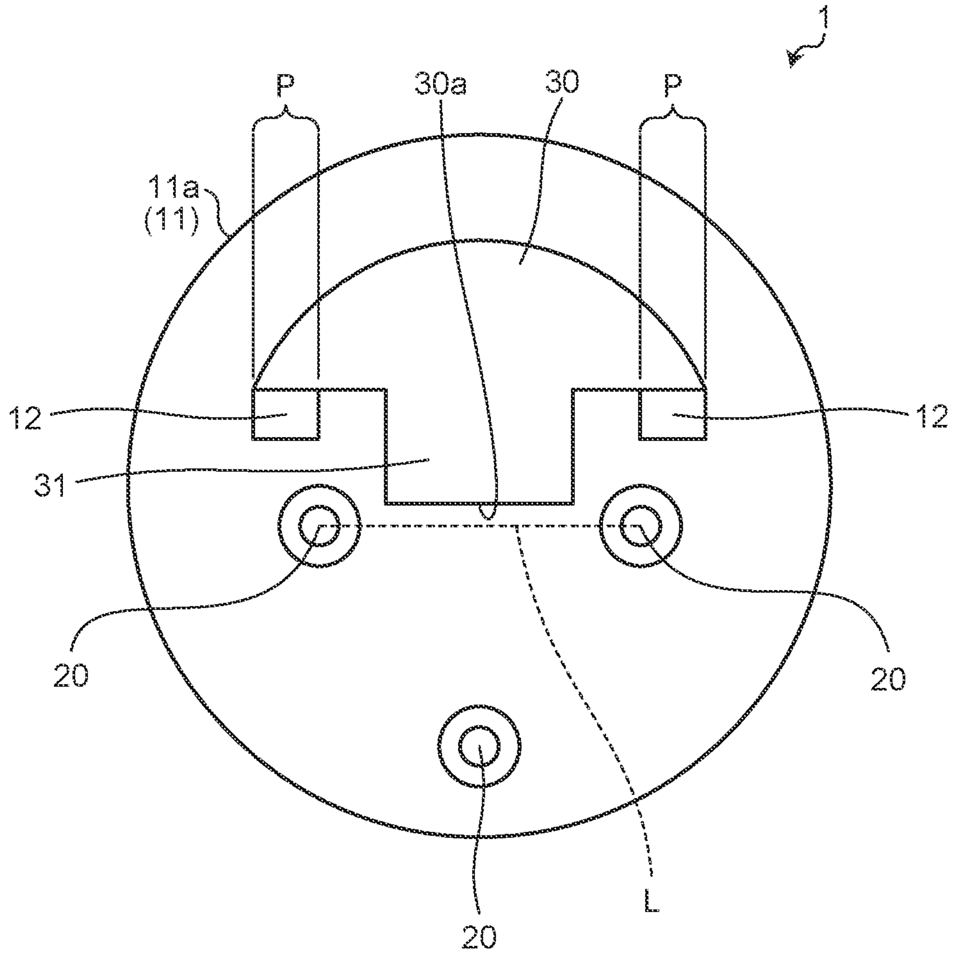
FIG. 8 is a plan view of a stem according to a second modification of the embodiment viewed from the upper surface side.

FIG. 8 is a plan view of the stem 1 according to a second modification of the embodiment viewed from the upper surface 11*a* side. In the second modification illustrated in FIG. 8, the configuration of the block member 30 is different from the embodiment described above.

Specifically, in the second modification, the block member 30 includes a projecting portion 31 that projects in a direction intersecting a line segment L that connects the leads 20 that are disposed opposite the block member 30 and that are adjacent each other from among the plurality of leads 20. Then, in the second modification, the device mounting surface 30*a* is formed at the tip of the projecting portion 31. In this way, by forming the device mounting surface 30*a* included in the block member 30 at the tip of the projecting portion 31 that projects in the direction intersecting the line segment L that connects the leads 20 that are adjacent each other, it is possible to arrange the device mounting surface 30*a* closer to the leads 20 that are adjacent each other.

Therefore, according to the second modification, it is possible to improve the degree of freedom of the arrangement of the device mounting surface 30*a*.

Figure 9:
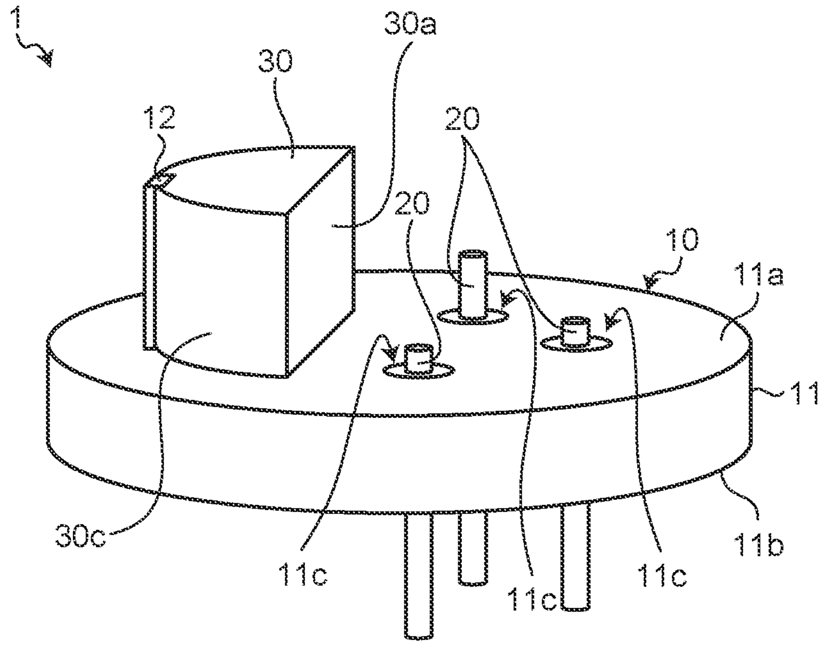
FIG. 9 is a perspective view illustrating a configuration of a stem according to a third modification of the embodiment.
Figure 10:
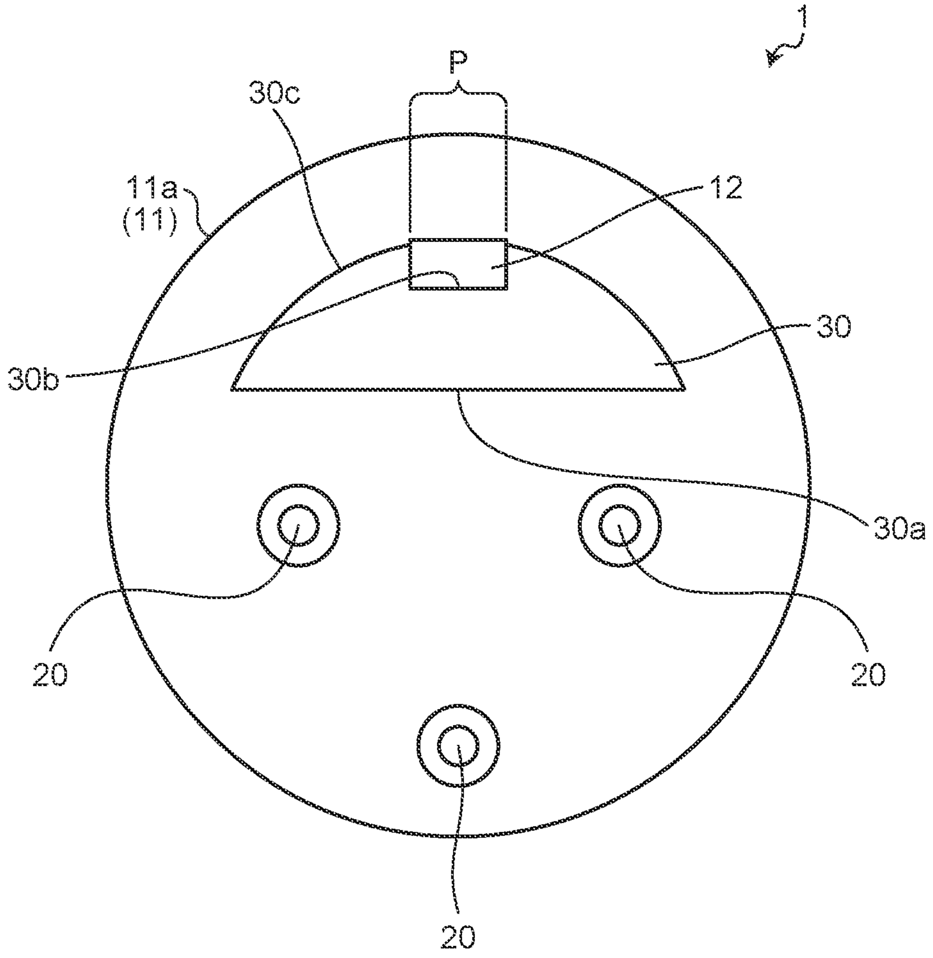
FIG. 10 is a plan view of the stem illustrated in FIG. 9 viewed from the upper surface side.

FIG. 9 is a perspective view illustrating a configuration of the stem 1 according to a third modification of the embodiment. FIG. 10 is a plan view of the stem 1 illustrated in FIG. 9 viewed from the upper surface 11*a* side. In the third modification illustrated in FIG. 9 and FIG. 10, the configuration of the base member 10 and the configuration of the block member 30 are different from the configurations described above in the embodiment.

Specifically, in the third modification, the base member 10 includes a single piece of the columnar portion 12 that rises from the upper surface 11*a* of the main body portion 11.

In addition, in the third modification, the block member 30 includes the area P in which the block member 30 is pressed against the columnar portion 12 on a side surface 30*c* side that is different from the side of the device mounting surface 30*a* in a plan view of the main body portion 11 viewed from the upper surface 11*a*. For example, the block member 30 includes the single area P that is associated with the single columnar portion 12 at the center part of the side surface 30*c* that is different from the side of the device mounting surface 30*a*. In this way, by providing the area P in which the block member 30 is pressed against the columnar portion 12 on the side surface 30*c* side that is different from the side of the device mounting surface 30*a*, it is possible to limit a movement of the block member 30 along the direction that is orthogonal to the device mounting surface 30*a*.

Therefore, according to the third modification, it is possible to ensure the accuracy of position of the device mounting surface 30*a* in the direction orthogonal to the device mounting surface 30*a*.

In addition, in the third modification, similarly to the first modification described above, the block member 30 may include the recess portion 30*b* in the area P in which the block member 30 is pressed against the columnar portion 12. As a result of this, it is possible to more stably prevent a positional shift of the device mounting surface 30*a* of the block member 30, and it is thus more stably ensure the accuracy of position of the device mounting surface 30*a*.

Figure 11:
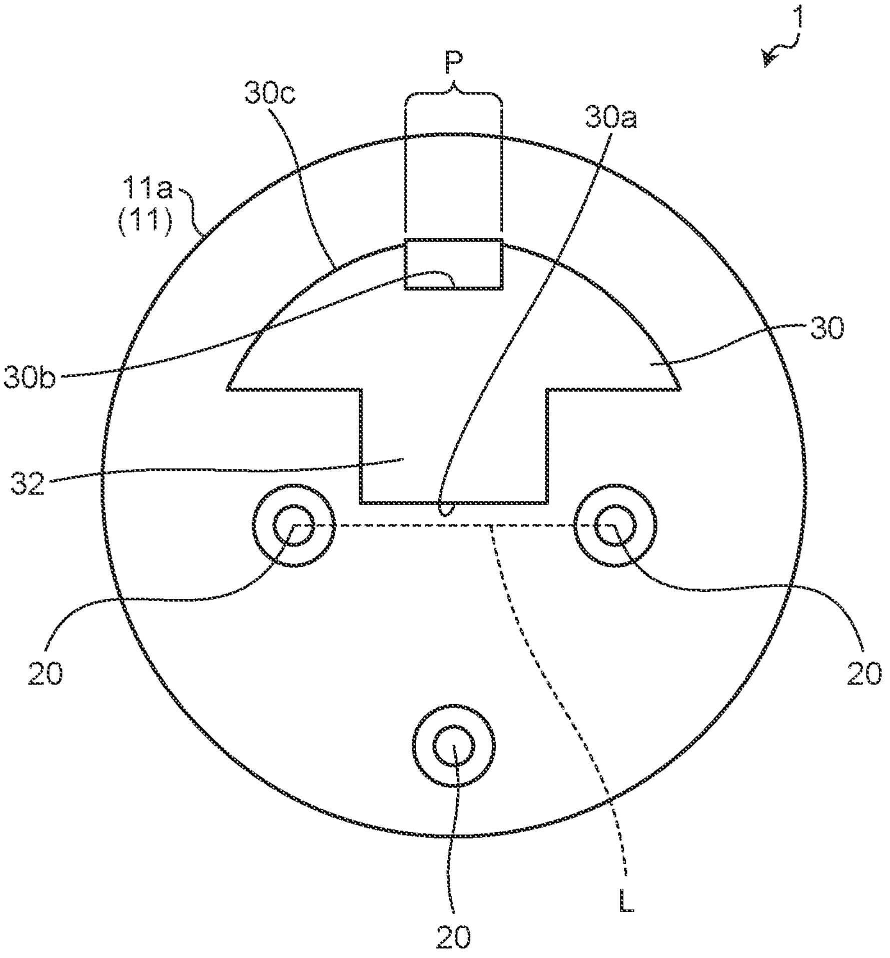
FIG. 11 is a plan view of a stem according to a fourth modification of the embodiment viewed from the upper surface side.

FIG. 11 is a plan view of the stem 1 according to a fourth modification of the embodiment viewed from the upper surface 11*a*. In the fourth modification illustrated in FIG. 11, the configuration of the block member 30 is different from the configuration described above in the third modification.

Specifically, in the fourth modification, the block member 30 includes a projecting portion 32 that projects in the direction intersecting the line segment L that connects the leads 20 that are disposed opposite the block member 30 from among the plurality of leads 20 and that are adjacent with each other. Then, in the fourth modification, the device mounting surface 30*a* is formed at the tip of the projecting portion 32. As described above, by forming the device mounting surface 30*a* at the tip of the projecting portion 32 that projects in the direction intersecting the line segment L that connects the leads 20 that are adjacent with each other and that are disposed opposite the block member 30, it is possible to arrange the device mounting surface 30*a* at the position closer to the leads 20 that are adjacent with each other.

Therefore, according to the fourth modification, it is possible to improve the degree of freedom of the arrangement of the device mounting surface 30*a*.

As described above, the stem (for example, the stem 1) according to the embodiment includes the base member (for example, the base member 10) and the block member (for example, the block member 30). The base member includes the main body portion (for example, the main body portion 11) and the columnar portion (for example, the columnar portion 12) that rises from one surface (for example, the upper surface 11*a*) of the main body portion. The block member includes the device mounting surface (for example, the device mounting surface 30*a*) on which a semiconductor device is able to be mounted, and that is fixed to the one surface of the main body portion in the state in which the block member is pressed against the columnar portion. As a result of this, with the stem according to the embodiment, it is possible to ensure the accuracy of position of the device mounting surface without performing a shape correction.

According to an aspect of an embodiment of the stem disclosed in the present application, an advantage is provided in that it is possible to ensure the accuracy of the position of the device mounting surface without performing the shape correction.

All examples and conditional language recited herein are intended for pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although the embodiment of the present invention has been described in detail, it should be understood that the various changes, substitutions, and alterations could be made hereto without departing from the spirit and scope of the invention.

What is claimed is:

1. A stem comprising:
a base member that includes
a main body portion, and
a columnar portion that rises from one surface of the main body portion; and
a block member that includes a device mounting surface, on which a semiconductor device is able to be mounted, and that is fixed to the one surface of the main body portion in a state in which the block member is pressed against the columnar portion,
wherein the columnar portion is integrally formed with the main body portion.

2. The stem according to claim 1, wherein
the block member includes an area which is pressed against the columnar portion on a same surface side as a side of the device mounting surface in a plan view of the main body portion viewed from the one surface.

3. The stem according to claim 1, wherein
the block member includes an area which is pressed against the columnar portion on another surface side that is different from a side of the device mounting surface in a plan view of the main body portion viewed from the one surface.

4. The stem according to claim 1, wherein the block member includes a recess portion in an area which is pressed against the columnar portion.

5. The stem according to claim 1, wherein
the base member includes a plurality of the columnar portions, and
the block member is fixed to the one surface of the main body portion in a state in which the block member is pressed against the plurality of the columnar portions.

6. The stem according to claim 1, further includes
a plurality of leads that are respectively fixed to a plurality of through-holes each of which passes through the main body portion in a thickness direction, wherein
the block member includes a projecting portion that projects in a direction intersecting a line segment that connects the leads that are disposed opposite the block member and that are adjacent each other from among the plurality of leads, and
the device mounting surface is formed at a tip of the projecting portion.

7. A method of manufacturing a stem comprising:
forming a base member that includes a main body portion and a columnar portion that rises from one surface of the main body portion; and
fixing a block member that includes a device mounting surface, on which a semiconductor device is able to be mounted, to the one surface of the main body portion while pressing the block member against the columnar portion,
wherein the forming the base member includes forming the columnar portion integrally with the main body portion.

* * * * *